United States Patent
Ohara et al.

(10) Patent No.: US 9,666,644 B2
(45) Date of Patent: May 30, 2017

(54) ORGANIC ELECTROLUMINESCENT ELEMENT

(71) Applicant: PANASONIC INTELLECTUAL PROPERTY MANAGEMENT CO., LTD., Osaka (JP)

(72) Inventors: Satoshi Ohara, Tokyo (JP); Hiroya Tsuji, Kyoto (JP); Kazuyuki Yamae, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/784,416

(22) PCT Filed: May 8, 2014

(86) PCT No.: PCT/JP2014/002431
§ 371 (c)(1),
(2) Date: Oct. 14, 2015

(87) PCT Pub. No.: WO2014/185032
PCT Pub. Date: Nov. 20, 2014

(65) Prior Publication Data
US 2016/0111475 A1 Apr. 21, 2016

(30) Foreign Application Priority Data
May 17, 2013 (JP) .................. 2013-105221

(51) Int. Cl.
*H01L 27/32* (2006.01)
*H01L 51/50* (2006.01)
*H01L 51/52* (2006.01)

(52) U.S. Cl.
CPC ...... *H01L 27/3209* (2013.01); *H01L 27/3211* (2013.01); *H01L 51/50* (2013.01);
(Continued)

(58) Field of Classification Search
None
See application file for complete search history.

(56) References Cited

U.S. PATENT DOCUMENTS 8,518,558 B2 * 8/2013 Hiyama ............... H01L 51/004
257/E51.044
2005/0134174 A1 6/2005 Shiratori et al.
(Continued)

FOREIGN PATENT DOCUMENTS

JP 2005-183213 7/2005
JP 2006-324016 11/2006
(Continued)

OTHER PUBLICATIONS

Blankenbach, K., Organic Light Emitting Diodes (OLED), Display Lab, Pforzheim University, Workshop 2014.*
(Continued)

*Primary Examiner* — Joseph Schoenholtz
(74) *Attorney, Agent, or Firm* — Greenblum & Bernstein, P.L.C.

(57) ABSTRACT

Three light-emitting units are included. Two light-emitting units of the three light-emitting units are similar-color light-emitting units that emit light in a similar color, and have mutually different luminance lives. A remaining light-emitting unit of the three light-emitting units is a different-color light-emitting unit that emits light in a color that is different from the similar color, and has a luminance life that is shorter than each luminance life of the two similar-color light-emitting units.

14 Claims, 6 Drawing Sheets

(52) U.S. Cl.
CPC ........ *H01L 51/504* (2013.01); *H01L 51/5012* (2013.01); *H01L 51/5016* (2013.01); *H01L 51/5044* (2013.01); *H01L 51/5278* (2013.01)

(56) References Cited

U.S. PATENT DOCUMENTS

| | | |
|---|---|---|
| 2010/0295027 A1 | 11/2010 | Kawamura et al. |
| 2011/0285276 A1* | 11/2011 | Kadoma .............. C07D 403/10 313/504 |
| 2012/0248424 A1* | 10/2012 | Sasaki ................... H01L 51/504 257/40 |
| 2015/0207092 A1 | 7/2015 | Tsuji et al. |
| 2015/0311453 A1 | 10/2015 | Tsuji et al. |

FOREIGN PATENT DOCUMENTS

| | | |
|---|---|---|
| JP | 2010-049818 | 3/2010 |
| WO | 2010/134613 | 11/2010 |

OTHER PUBLICATIONS

USPTO Retrieval of Foreign Priority Applications From the WIPO Via the Digital Access Service downloaded from URL< https://www.uspto.gov/sites/default/files/patents/process/file/pdx/document_retrieval.pdf> on Mar. 4, 2017.*
International Search Report in PCT/JP2014/002431, dated Aug. 19, 2014.

* cited by examiner

Two-unit multi-element (reference example) luminance life

Three-unit multi-element (working example) luminance life

- ■ Long-life phosphorescent unit
- ✕ Short-life phosphorescent unit
- ▲ Three-unit multi-element
- ♦ Fluorescent unit

ORGANIC ELECTROLUMINESCENT ELEMENT

TECHNICAL FIELD

The present invention relates to an organic electroluminescent element.

BACKGROUND ART

Conventionally, an organic electroluminescent element having a plurality of light-emitting units, i.e., having a multi-unit structure, is known.

For example, with an organic EL element described in Patent Document 1, a plurality of light-emitting units exhibiting organic EL light emission are connected in series, and a portion or all of the light-emitting surfaces of the plurality of light-emitting units are stacked to form a light-emitting surface. In addition, the plurality of light-emitting units include light-emitting units exhibiting at least two or more different luminescent colors, the light-emitting units exhibiting at least one color are formed in multiple layers to obtain a desired mixed color that is a composite of the different luminescent colors from the light-emitting surfaces.

Also, an organic electroluminescent element described in Patent Document 2 includes at least one first light-emitting unit including a plurality of organic light-emitting layers that are stacked, and at least one second light-emitting unit including an organic light-emitting layer having a single layer structure. In addition, the light-emitting units are sandwiched between an anode and a cathode in a state of being stacked with a connection layer therebetween for supplying an electrical charge to the light-emitting units.

CITATION LIST

Patent Literature

Patent Document 1: JP 2005-183213A
Patent Document 2: JP 2006-324016A

SUMMARY OF INVENTION

Technical Problem

It is important to hinder the luminescent color of an organic luminescent element from aging. If the luminescent color changes, there is a possibility that a target luminescence cannot be obtained, resulting in failure in luminescence. The luminescent colors are properties of each type of light sensed by a human according to the color or intensity of light, and can be quantified as chromaticity. Therefore, in order to extend the life of an organic luminescent element, there is need to design an organic luminescent element such that the chromaticity does not change as much as possible.

However, with conventional organic luminescent elements, shifting in luminescent color occurs due to usage, and in an organic luminescent element with a plurality of light-emitting layers, the light-emitting layers differ from each other in the degree of luminescent color shift, and respective colors are unbalanced. Therefore, it is not easy to produce an organic electroluminescent element whose luminescent color is unlikely to change.

The present invention has been made in view of the above-described points, and an object thereof is to provide an organic luminescent element that is capable of reducing aging of chromaticity and suppressing color shift.

Solution To Problem

An organic electroluminescent element according to the present invention, includes:
three light-emitting units,
two light-emitting units of the three light-emitting units being similar-color light-emitting units that emit light in a similar color, and have mutually different luminance lives,
a remaining light-emitting unit of the three light-emitting units being a different-color light-emitting unit that emits light in a color that is different from the similar color, and has a luminance life that is shorter than each luminance life of the two similar-color light-emitting units.

In the organic electroluminescent element,
the different-color light-emitting unit preferably includes a light-emitting layer containing a blue light-emitting material.

In the organic electroluminescent element,
the different color light-emitting unit preferably includes a light-emitting layer containing a fluorescent material as a light-emitting material.

In the organic electroluminescent element,
the two similar-color light-emitting units preferably include respective light-emitting layers that differ in layered structure or composition.

In the organic electroluminescent element,
the two similar-color light-emitting units preferably include respective light-emitting layers containing a phosphorescent material as a light-emitting material.

In the organic electroluminescent element,
the two similar-color light-emitting units preferably include respective light-emitting layers containing both a red light-emitting material and a green light-emitting material.

In the organic electroluminescent element,
preferably, the two similar-color light-emitting units include respective light-emitting layers which contain light-emitting materials and each of which contains at least one identical light-emitting material.

In the organic electroluminescent element,
preferably, the two similar-color light-emitting units include respective light-emitting layers which contain light-emitting materials and each of which contains at least one different light-emitting material.

Advantageous Effects of Invention

According to the present invention, it is possible to reduce aging of chromaticity, and to suppress color shift.

DESCRIPTION OF EMBODIMENTS

Hereinafter, an embodiment of the present invention will be described.

Figure 1:
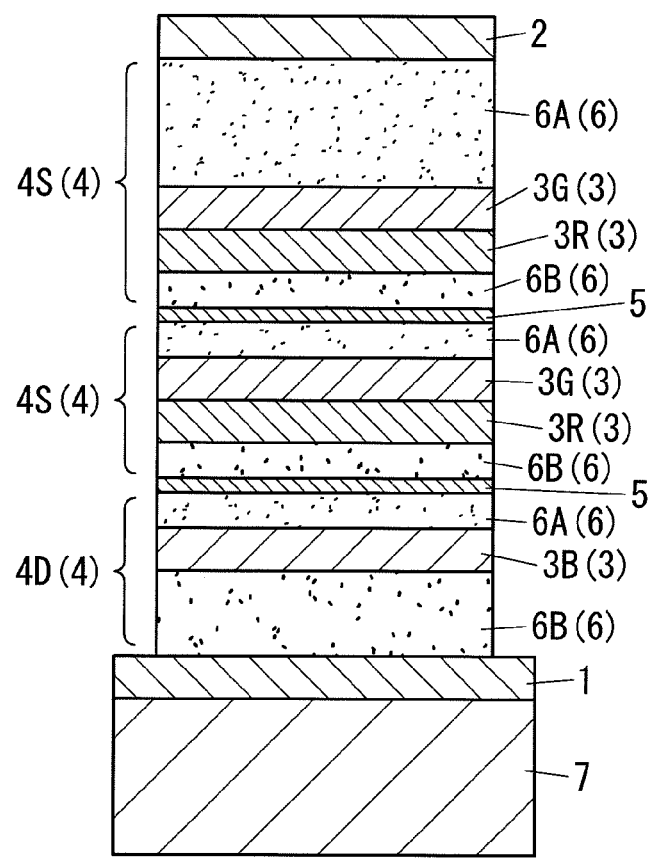
FIG. 1 is a cross-sectional view schematically showing a layer configuration of an organic luminescent element having a three-stage multi-unit structure.

FIG. 1 shows an example of an organic electroluminescent element according to an embodiment (also referred to as an "organic EL element" hereinafter).

The organic EL element includes a light transmissive electrode 1, a light reflective electrode 2, and three light-emitting units 4. The light reflective electrode 2 is an electrode paired with the light transmissive electrode 1. The light-emitting units 4 are provided between the light transmissive electrode 1 and the light reflective electrode 2. Each of the light-emitting units 4 has one or more light-emitting layers 3. Using three light-emitting units 4 makes it easy to adjust respective luminescent colors and produce a desired color.

The light-emitting unit 4 has layered structure that is sandwiched between an anode and a cathode and has a function of emitting light if voltage is applied therebetween. This layered structure is also referred to as an "organic EL layer". The structure of an organic EL element having a plurality of light-emitting units 4 is referred to as a "multi-unit structure". The multi-unit structure is a structure in which a plurality of light-emitting units 4 that are stacked in layers are electrically connected in series and disposed between one anode and one cathode. The organic EL element of the embodiment shown in FIG. 1 includes three light-emitting units 4, and therefore has a three-stage multi-unit structure. Hereinafter, this organic EL element is also referred to as a "three-unit multi-element". Also, the organic EL element of a reference example shown in FIG. 6 includes two light-emitting units 4, and therefore has a two-stage multi-unit structure. Hereinafter, this organic EL element is also referred to as a "two-unit multi-element". Note that an organic EL element having a single light-emitting unit 4 has a single-unit structure.

In the organic EL element having a multi-unit structure, an interlayer 5 is provided between adjoining light-emitting units 4 in general. The interlayer 5 is a layer having a function of injecting an electrical charge into each light-emitting unit 4 adjacent thereto. Providing the interlayer 5 enables the light-emitting units 4 to emit light favorably. The interlayer 5 can exhibit an electrode-like function, and thus is also referred to as an "electrical charge generation layer". The interlayer 5 has a function of injecting electrons into a layer on the anode side and injecting holes (positive holes) into a layer on the cathode side. In the case where the light transmissive electrode 1 serves as the anode, the interlayer 5 has a function of injecting electrons into the light-emitting unit 4 adjacent to the light transmissive electrode 1 side. In the case where the light reflective electrode 2 serves as the cathode, the interlayer 5 has a function of injecting holes (positive holes) into the light-emitting unit 4 on the side of the light reflective electrode 2. In the embodiment shown in FIG. 1, one interlayer 5 is provided between every two adjoining light-emitting units 4.

The organic EL element may include a substrate 7. In this case, a light-emitting layered body including a layered body extending from the light transmissive electrode 1 to the light reflective electrode 2 is formed on the surface of the substrate 7. The substrate 7 serves as a base material supporting the light-emitting layered body. In the embodiment shown in FIG. 1, the light transmissive electrode 1 is formed on the surface of the substrate 7. In this case, the substrate 7 has preferably optical transmission property, and accordingly can allow light to exit through. The structure in which light is allowed to exit through the substrate 7 is referred to as a "bottom emission structure". Also, the organic EL element may have a structure in which the light reflective electrode 2 is formed on the surface of the substrate 7, as a different structure from that of the embodiment shown in FIG. 1. In this case, if the substrate 7 shown in FIG. 1 is removed and a substrate 7 is drawn on the light reflective electrode 2 in FIG. 1, the above-described layered structure is drawn as a variation of the embodiment shown in FIG. 1. In the case where the substrate 7 is provided on the light reflective electrode 2 side, the substrate 7 need not be transparent. Light is allowed to exit from the side opposite to the substrate 7. The structure in which light is allowed to exit from the side opposite to the substrate 7 is referred to as a "top emission structure". The organic EL element may have the bottom emission structure or the top emission structure. However, the bottom emission structure in which the light transmissive electrode 1 is provided on the surface of the substrate 7 is advantageous as a light-emitting device for lighting.

Two light-emitting units 4 of the three light-emitting units 4 are similar-color light-emitting units 4S and the remaining light-emitting unit 4 is a different-color light-emitting unit 4D.

The two similar-color light-emitting units 4S are configured to emit light in a similar color. Although the similar colors refer to adjoining colors or colors located close to one another in a color circle, for example, the similar colors may be the same color. Specifically, in the case where the difference in weighted average emission wavelength between two light-emitting units 4 is less than 20 nm, these light-emitting units 4 serve as the similar-color light-emitting units 4S.

Here, the weighted average emission wavelength is a wavelength calculated with the integral of spectrum intensities obtained by measuring spectra showing intensities of emission wavelengths (emission spectra), and is expressed by Equation (1) below.

[Equation 1] (1)

$$\lambda_w = \frac{\int_{380}^{780} \lambda * P(\lambda) d\lambda}{\int_{380}^{780} P(\lambda) d\lambda}$$

In Equation (1) above, λ expresses wavelength (nm) and P (λ) expresses spectrum intensity at a wavelength.

Furthermore, the two similar-color units 4S have mutually different luminance lives. That is, one similar-color unit 4S has a longer luminance life, and the other similar-color unit 4S has a shorter luminance life.

Also, the different-color light-emitting unit 4D is configured to emit light in a color that is different from the above-described similar color. It is sufficient that the color thereof is different from the above-described similar color, and thus examples thereof include a color located directly opposite to the above-described similar-color in the color circle (complementary color) or a color adjacent to the direct opposite color (opposite color). Specifically, it is sufficient that the difference between the weighted average emission wavelength of the different-color light-emitting unit 4D and the weighted average emission wavelength of each of the two light-emitting units 4S is 100 nm or more.

Furthermore, the luminance life of the different-color light-emitting unit 4D is shorter than each luminance life of the two similar-color light-emitting units 4S. In other words, the luminance life of the different-color light-emitting unit 4D is even shorter than that of the similar-color light-emitting unit 4S, which is shorter than that of the other similar-color light-emitting unit 4S.

The light-emitting unit 4 that is located the closest to the light reflective electrode 2 and the light-emitting unit 4 that adjoins this are preferably the similar-color light-emitting units 4S. The similar-color light-emitting unit 4S may have a plurality of light-emitting layers 3, or may have a single light-emitting layer 3. The single light-emitting layer 3 may contain a single light-emitting material, or may contain a plurality of light-emitting materials. In the embodiment shown in FIG. 1, the similar-color light-emitting unit 4S has a plurality of light-emitting layers 3. The similar-color light-emitting unit 4S that is located the closest to the light reflective electrode 2 may have a longer luminance life or a shorter luminance life.

The light-emitting unit 4 that is located the closest to the light transmissive electrode 1 is preferably the different-color light-emitting unit 4D. The different-color light-emitting unit 4D may have a plurality of light-emitting layers 3 or a single light-emitting layer 3. The single light-emitting layer 3 may contain a single light-emitting material, or may contain a plurality of light-emitting materials. In the embodiment shown in FIG. 1, the different-color light-emitting unit 4D has a single light-emitting layer 3.

In the organic EL element, the plurality of light-emitting layers 3 preferably contain a red light-emitting layer 3R, a green light-emitting layer 3G, and a blue light-emitting layer 3B. As a result of including the light-emitting layers 3 having three colors, namely, red, green, and blue (RGB), various colors can be produced. In particular, mixing these colors enables white light emission. With the organic EL element, a planar lighting device can be formed due to white light emission. The red light-emitting layer 3R is the light-emitting layer 3 containing a red light-emitting material. The green light-emitting layer 3G is the light-emitting layer 3 containing a green light-emitting material. The blue light-emitting layer 3B is the light-emitting layer 3 containing a blue light-emitting material.

The blue light-emitting material refers to a light-emitting material showing a spectrum having the highest intensity in the wavelength range from 420 nm or more to less than 500 nm. The green light-emitting material refers to a light-emitting material showing a spectrum having the highest intensity in the wavelength range from 500 nm or more to less than 590 nm. The red light-emitting material refers to a light-emitting material showing a spectrum having the highest intensity in the wavelength range from 590 nm or more to less than 700 nm. Strictly speaking, although a light-emitting material may have a luminescent color other than red, green, and blue, such as orange, for example, even in this case, in this specification, luminescent colors are divided into three colors, and are considered to exhibit these three colors as long as they are within the definition of the colors in the above-described wavelength ranges.

In the organic EL element, the two similar-color light-emitting units 4S preferably include respective light-emitting layers 3 containing both the red light-emitting material and the green light-emitting material. In this way, the light-emitting layers 3 of the similar-color units 4S contain both the red light-emitting material and the green light-emitting material, and thereby energy is transferred from red to green, as a result of which luminous efficiency can be further increased and the life can also be further increased accordingly. Furthermore, in this case, if the different-color light-emitting unit 4D includes the light-emitting layer 3 containing the blue light-emitting material, the organic EL element can include the light-emitting layer 3 having three colors, namely, red, green, and blue (RGB), as a result of which various colors can be produced. In the embodiment shown in FIG. 1, each similar-color light-emitting unit 4S includes the red light-emitting layer 3R containing the red light-emitting material, and the green light-emitting layer 3G containing the green light-emitting material in a stacked manner. Although the red light-emitting layer 3R is disposed on the light transmissive electrode 1 side and the green light-emitting layer 3G is disposed on the light reflective electrode 2 side, their positions may be revered. Although not shown, the single light-emitting layer 3 may contain both the red light-emitting material and the green light-emitting material.

Figure 2:
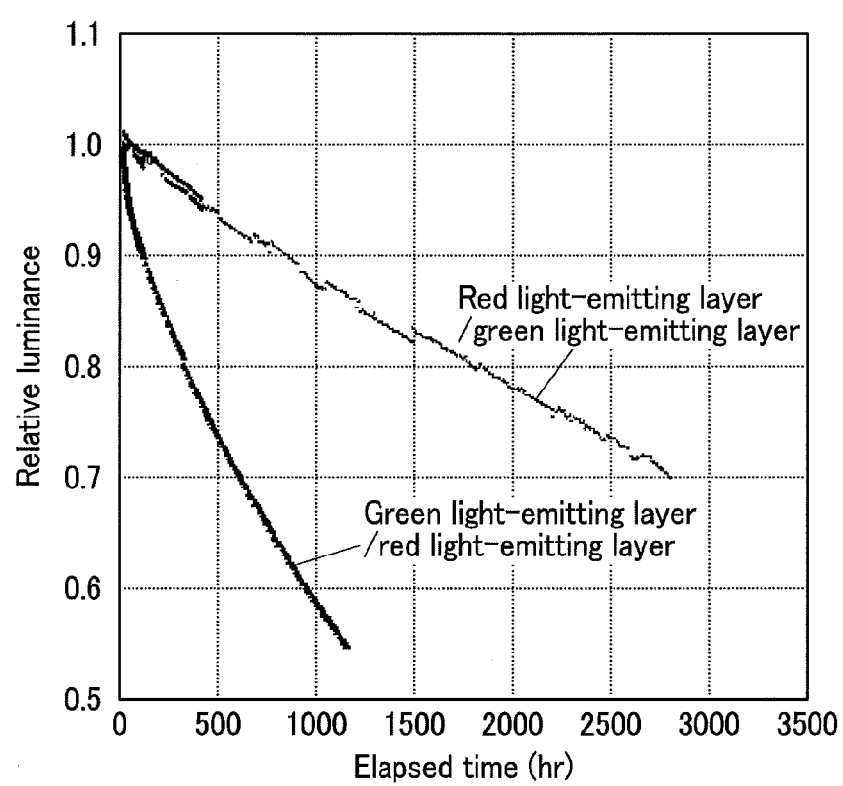
FIG. 2 is a graph showing luminance lives of two similar-color light-emitting units including respective light-emitting layers that differ in layered structure.

The two similar-color light-emitting units 4S preferably include respective light-emitting layers 3 that differ in layered structure or composition. For example, FIG. 2 is a graph showing the luminance lives of the similar-color light-emitting units 4S when the layered structures are made different from each other by making the orders of stacking these light-emitting layers 3 different from each other in the case where the similar-color light-emitting unit 4S include the red light-emitting layer 3R and the green light-emitting layer 3G. The horizontal axis expresses elapsed time, and the vertical axis expresses relative luminance (corresponding to $L/L_0$, where initial luminance is $L_0$ and luminance is L). In FIG. 2, "red light-emitting layer/green light-emitting layer" indicates a luminance decay curve in the case where the red light-emitting layer 3R is disposed on the light exit side and the green light-emitting layer 3G is disposed on the side opposite thereto. In contrast, "green light-emitting layer/red light-emitting layer" indicates a luminance decay curve in the case where the green light-emitting layer 3G is disposed on the light exit side and the red light-emitting layer 3R is disposed on the side opposite thereto. A constant-current driving test was performed so that both "red light-emitting layer/green light-emitting layer" and "green light-emitting layer/red light-emitting layer" have the same initial luminance. As is clear from FIG. 2, it is understood that "red light-emitting layer/green light-emitting layer" has a longer luminance life and "green light-emitting layer/red light-emitting layer" has a shorter luminance life. In this manner, even if the two similar-color light-emitting units 4S are made of the same material, these luminance lives can be easily made different from each other by making the layered structures different from each other. Also, luminance lives of the two light-emitting units 4S can be easily made different from each other by making compositions, such as the type of light-emitting material and doping concentration.

Also, the two similar-color light-emitting units 4S may include respective light-emitting layers 3 containing light-emitting materials and each of which may contain at least one identical light-emitting material. In this manner, even if the plurality of light-emitting materials are partially identical, if the remaining light-emitting material is different therefrom, luminance lives of the two similar-color light-emitting units 4S can be easily made different from each other. Also, even if all of the plurality of light-emitting materials are identical, if the layered structures are made different from each other in the above-described manner, luminance lives of the two similar-color light-emitting units 4S can be easily made different from each other.

Also, it is sufficient that the two similar-color light-emitting units 4S include respective light-emitting layers 3 containing light-emitting materials and each of which contains at least one different light-emitting material. In this manner, if the plurality of light-emitting materials are partially different from each other, luminance lives of the two similar-color light-emitting units 4S can be easily made different from each other. Of course, if all of the plurality of light-emitting materials are different from each other, luminance lives of the two similar-color light-emitting units 4S can be easily made different from each other.

Also, the two similar-color light-emitting units 4S preferably include the respective light-emitting layers 3 containing a phosphorescent material as a light-emitting material. In the embodiment shown in FIG. 1, each similar-color light-emitting unit 4S includes the red light-emitting layer 3R containing the red light-emitting material, and the green light-emitting layer 3G containing the green light-emitting material in a stacked manner. In this case, if one or both of the red light-emitting material and the green light-emitting material is a phosphorescent material, for example, the luminous efficiency of the organic EL element can be improved.

Also, with the organic EL element, the different-color light-emitting unit 4D preferably includes the light-emitting layer 3 containing the blue light-emitting material. In this case, if the two similar-color light-emitting units 4S include the respective light-emitting layers 3 containing the red light-emitting material and the green light-emitting material, the organic EL element can include the light-emitting layer 3 having three colors, namely, red, green, and blue (RGB), and can produce various colors.

Also, the different-color light-emitting unit 4D preferably includes the light-emitting layer 3 containing a fluorescent material as the light-emitting material. In this case, if the two similar-color light-emitting units 4S include the respective light-emitting layers 3 containing the phosphorescent material, it is easy to make the luminance life of the different-color light-emitting unit 4D shorter than each luminance life of the two similar-color light-emitting units 4S. Also, in general, fluorescent materials often have desired emission spectra and lives and are highly practical materials, and therefore, white light emission having a favorable luminescent color can be realized in organic EL elements.

In the organic EL element shown in FIG. 1, the red light-emitting layer 3R is disposed in each of the two similar-color light-emitting units 4S. Therefore, the thickness of the red light-emitting layer 3R can be made thin in each similar-color light-emitting unit 4S. Here, in the organic EL element having a plurality of light-emitting layers 3, a structure in which two or more light-emitting layers 3 are stacked directly may be formed. In this case, if the light-emitting layer 3 made of a light-emitting material having a short wavelength adjoins a light-emitting layer 3 made of a light-emitting material having a long wavelength, a phenomenon may occur in which energy of the layer having a short wavelength is absorbed by the layer having a long wavelength, emission of light having a short wavelength is relatively weakened, and emission of light having a long wavelength is strengthened to an excessive degree (excessive light emission). The short wavelength and the long wavelength of the light-emitting material are relative to each other. Among the three colors of light that are emitted, the red light-emitting material emits light having a longer wavelength. Among the three colors of light that are emitted, the blue light-emitting material emits light having a shorter wavelength. Therefore, there is a risk that only stacking light-emitting layers 3 having the respective three colors strengthens the red color to an excessive degree and weakens the blue and green colors. In view of this, the red light-emitting layer 3R is disposed in each of the two similar-color light-emitting units 4S. Accordingly, a desired red color overall can be formed by combining the plurality of red light-emitting layers 3R, and the thickness of each red light-emitting layer 3R can be reduced. In addition, by reducing the thickness of the red light-emitting layer 3R to be less than the thickness of the green light-emitting layer 3G, a phenomenon in which energy of the green layer is absorbed by the red layer can be suppressed. Therefore, color adjustment can be easily made and luminous efficiency can be improved. Also, such absorption of energy of the light-emitting layer 3 that emits light having a short wavelength can be suppressed, and therefore driving with a lower voltage becomes possible.

Also, if the red light-emitting layers 3R are distributed between the two similar-color light-emitting units 4S, aging of color of each light-emitting unit 4, i.e., color shift, can be suppressed. As described above, the red light-emitting layer 3R may absorb energy of another light-emitting layer 3. Accordingly, if the red light-emitting layer 3R is thick, there is a risk that emission is likely to be unbalanced, a difference in degree of color shift between light-emitting units 4 increases, and overall color shift increases. However, by distributing the red light-emitting layers 3R between the two similar-color light-emitting units 4S, a difference in color shift over time between light-emitting units 4 can be suppressed, and therefore overall color shift in emission can be suppressed, as a result of which an organic EL element having a longer life can be obtained.

Although two light-emitting units 4 of the three light-emitting units 4 include the respective red light-emitting layers 3R in the embodiment shown in FIG. 1, all of the three light-emitting units 4 may include respective red light-emitting layers 3R.

A favorable aspect is that only one light-emitting unit 4 of the three light-emitting units 4 includes the blue light-emitting layer 3B. In the embodiment shown in FIG. 1, the different-color light-emitting unit 4D includes the blue light-emitting layer 3B, and the two similar-color light-emitting units 4S include no blue light-emitting layer 3B. There are cases in which emission of light from the blue light-emitting material needs high energy compared to other luminescent colors. In this case, it may be said that the blue light-emitting layer 3B has a resistance value that is higher than that of a light-emitting layer 3 having another color. If the blue light-emitting layer 3B is disposed in each of a plurality of light-emitting units 4, there is a risk that the blue light-emitting material will emit light from each light-emitting unit 4, and therefore resistance will increase and the driving voltage will increase. In view of this, by forming the blue light-emitting layer 3B in one light-emitting unit 4 only, the number of blue light-emitting layers 3B is reduced, and therefore it is possible to suppress a case in which the driving voltage increases.

The light-emitting layer 3 may include light-emitting dopants (light-emitting materials), and a host, which serves as a medium that accepts the light-emitting dopants. The light-emitting dopant is made of a light-emitting material with phosphorescence, a light-emitting material with fluorescence, or the like. The blue light-emitting material is preferably a phosphorescent material. Accordingly, driving with a low voltage becomes possible. Also, the red light-emitting material is preferably a phosphorescent material. Also, the green light-emitting material is preferably a phosphorescent material. Usually, the fluorescent material needs a larger amount of energy than the phosphorescent material. Therefore, it is preferable to use the phosphorescent material. Using the phosphorescent material can increase the efficiency of light being allowed to exit and reduce the voltage easily. It is more preferable that all of the light-emitting materials included in the plurality of light-emitting layers 3 be the phosphorescent material. A so-called all-phosphorescent organic EL element is preferable. Accordingly, an organic EL element that is driven with a lower voltage can be configured. Note that a dopant other than the dopants that are categorized into a so-called phosphorescence or fluorescence may be used as the light-emitting material (dopant). For example, in recent years, light-emitting materials whose energy level transits from the energy level of phosphorescence to that of fluorescence and that emit light have been developed, and such a light-emitting material may be used.

It is preferable to use a light-emitting material showing a spectrum having the highest intensity in the wavelength range from 460 nm or more to less than 500 nm. Accordingly, it is easier to obtain light emission having a white color and high efficiency. Colors produced by mixing three colors, namely, red, green, and blue, can be made into a chart according to chromaticity coordinates, for example. For example, a color chart serves as a chromaticity diagram expressed by color coordinates u'v'. In a case of using a plurality of colors, a color may be defined as a point derived by the wavelength and intensity of each color. If this point enters into a white region of the chromaticity diagram, white light can be emitted. In the chromaticity diagram, a blue wavelength position is more important than a red or green wavelength position in causing the point to enter the white region. In view of this, in the case of using the blue light-emitting material having a wavelength of 460 nm or more, higher luminance can be obtained with respect to the same emission energy, and therefore it is possible to make it easier to obtain white light emission with higher efficiency. Of course, even if the blue light-emitting material indicating a spectrum having the highest intensity in the wavelength range from 400 nm or more to less than 460 nm is used, a white color can be produced by adjusting red and green, or the emission spectrum of blue light, and therefore such a blue light-emitting material may be used. Also, in the case of using the blue light-emitting material having a wavelength of less than 460 nm, the effect of extending a region of the color temperature of the white color to be produced is easily obtained, and therefore the degree of freedom of white light emission can be increased.

The luminescent color produced by mixing three colors, namely, red, green, and blue, depends on a value obtained by integrating the emission spectrum of each light-emitting material. The luminescent color can be easily made white due to the value obtained by integrating the emission spectrum taking a desired ratio. As the ratio of emission intensity, the ratio of the integrated value of red emission spectrum:the integrated value of green emission spectrum:the integrated value of blue emission spectrum is preferably about 2:1:1. Accordingly, white light emission can be more easily realized. In the case of using the blue light-emitting material indicating a spectrum having the highest intensity in the wavelength range from 460 nm or more to less than 500 nm, the above-described ratio of the integrated values can be more easily achieved. Also, in the case of using the blue light-emitting material having a wavelength of less than 460 nm, in order to obtain white light emission, the intensity of blue light emission may be less than 25% of the entire intensity (100%). Here, the percentage of the integrated value of the red emission spectrum being high means that the total thickness of the red light-emitting layers 3R needs to be relatively thicker than those of the other light-emitting layers 3. However, as described above, if the red light-emitting layer 3R is thick, the energy is likely to be absorbed. In view of this, in order to make the luminescent color white, the red light-emitting layer 3R is preferably disposed in each of the plurality of light-emitting units 4. Note that the integrated value of each color emission spectrum may be considered to be almost equivalent to each color emission intensity.

In the case where one light-emitting unit 4 includes a plurality of light-emitting layers 3, a thin light-emitting layer 3 and a thick light-emitting layer 3 may be formed. At this time, for example, the thickness of the thin layer may be set to ⅘ the thickness of the thick layer or less. Preferably, the thickness of the thin layer may be set to ¾ the thickness of the thick layer or less. More preferably, the thickness of the thin layer may be set to ⅔ the thickness of the thick layer or less. Even more preferably, the thickness of the thin layer may be set to ½ the thickness of the thick layer or less. For example, in the case of a layered structure of the red light-emitting layer 3R and the green light-emitting layer 3G, the thickness of the red light-emitting layer 3R may be set to 10 nm or less, and the thickness of the green light-emitting layer 3G may be set to 20 nm or more. However, if the thickness of the light-emitting layer 3 having a specific color is excessively reduced, there is a risk that desired light emission cannot be obtained. Therefore, preferably, the thickness of the thin layer may be set to ¼ the thickness of the thick layer or more. More preferably, the thickness of the thin layer may be set to ⅓ the thickness of the thick layer or more. Also, in order to easily obtain light emission, of course, the thickness of the thin layer may be set to ½ the thickness of the thick layer or more or ⅔ the thickness thereof or more.

In order to obtain desired light emission, the thickness of each light-emitting layer 3 is preferably 1 nm or more, preferably 5 nm or more, and more preferably 7 nm or more. Also, from the point of view of luminous efficiency or the like, the thickness of each light-emitting layer 3 is preferably 100 nm or less, 50 nm or less, and more preferably 40 nm or less. The thickness of one blue light-emitting layer 3B is preferably 20 nm or more. Accordingly, it is easier to obtain an element that has good light emitting properties, can be driven with a low voltage, and in which color shift is suppressed. Also, the thickness of one red light-emitting layer 3R is preferably 20 nm or less, and more preferably 10 nm or less. Accordingly, it is easier to obtain an element that has good light emitting properties, can be driven with a low voltage, and in which color shift is suppressed. In the organic EL element shown in FIG. 1, a plurality of red light-emitting layers 3R are provided, but these red light-emitting layers 3R are disposed separately in different light-emitting units 4, and therefore the intensity of red is obtained by the sum thereof. Therefore, even if the thickness of the red light-emitting layer 3R is reduced, a desired luminescent color (white, in particular) can be obtained.

Note that preferably, the relationship between the thicknesses of light-emitting layers 3 is a relationship in one light-emitting unit 4, though the thickness of the red light-emitting layer 3R in one light-emitting unit 4 may be thicker than the thickness of the blue light-emitting layer 3B or the green light-emitting layer 3G in another light-emitting unit 4, for example. This is because strong energy absorption occurs between adjoining light-emitting layers 3. Also, in general, the effect of optical interference varies depending on the position or thickness of the light-emitting layer 3, and therefore it is sufficient that the thickness of the light-emitting layer 3 is designed for each light-emitting unit 4.

As described above, in the organic EL element shown in FIG. 1, two light-emitting units 4 of the three light-emitting units 4 are similar-color light-emitting units 4S. In this case, when the light-emitting layers 3 of the two similar-color light-emitting units 4S are formed, an identical light-emitting material may be used. Accordingly, the number of materials can be reduced and a stacking process can be simplified, and therefore manufacturing can be performed easily and at a low cost. In the above-described organic EL element, a plurality of red light-emitting layers 3R are separately disposed in a plurality of light-emitting units 4, and therefore the red light-emitting material may be the identical material. Also, in the above-described organic EL element, a plurality of green light-emitting layers 3G are separately disposed in a plurality of light-emitting units 4, and therefore the green light-emitting material may be the identical material. In the case where two or more same-color light-emitting layers 3 are separately disposed in a plurality of light-emitting units 4, a portion of the color may be from the identical material. In all of the light-emitting layers 3 having the identical color, the same-color light-emitting layers 3 may be made of the identical light-emitting material. Also, the same may be applied not only to light-emitting materials (dopants) but also to the hosts. For example, in the embodiment shown in FIG. 1, light-emitting layers 3 having two colors, namely, red and green, are provided in the two similar-color light-emitting units 4S, and the red light-emitting layer 3R and the green light-emitting layer 3G in both light-emitting units 4 may be respectively made of the identical material. However, in this case, by making the layered structures of the light-emitting layers 3 different from each other or the like, the luminance lives of the two similar-color light-emitting units 4S are made different from each other. Note that in the case where the same-color light-emitting layers 3 are present in different light-emitting units 4, the thicknesses of the same-color light-emitting layers 3 may be the same or different from each other. In general, the effect of optical interference varies depending on the position or thickness of the light-emitting layer 3, and therefore it is sufficient that the thickness of the light-emitting layer 3 is designed for each light-emitting unit 4.

An appropriate layer that enables the organic EL element to be driven may be formed in a portion other than the light-emitting layer 3 in the light-emitting unit 4. For example, an electrical charge transport layer 6 may be formed. In the embodiment shown in FIG. 1, the electrical charge transport layer 6 is illustrated. The electrical charge transport layer 6 may be a layer for injecting or transporting holes or electrons. The electrical charge transport layer 6 is mainly constituted by an electron transport layer 6A and a positive hole transport layer 6B. In the light-emitting unit 4, preferably, the positive hole transport layer 6B is disposed on the anode side of the light-emitting layer 3 (light transmissive electrode 1 side in this example), and the electron transport layer 6A is disposed on the cathode side of the light-emitting layer 3 (light reflective electrode 2 side in this example). Note that even if the light-emitting layer 3 is in direct contact with an electrode or the light-emitting layer 3 is in direct contact with the interlayer 5, if desired light emission can be obtained, the electrical charge transport layer 6 need not be disposed at an appropriate location. Also, the electrical charge transport layer 6 may include an appropriate layer such as a positive hole injection layer, an electron injection layer, or the like. The positive hole injection layer may be formed on the anode side of the positive hole transport layer 6B. The electron injection layer may be formed on the cathode side of the electron transport layer 6A.

The light transmissive electrode 1 and the light reflective electrode 2 are electrodes forming a pair. Among these electrodes, one serves as the anode and the other serves as the cathode. Accordingly, the organic EL element can be driven. In the embodiment shown in FIG. 1, the anode may be constituted by the light transmissive electrode 1 and the cathode may be constituted by the light reflective electrode 2. In this case, it is easier to form an element having high light emitting properties. Of course, the cathode may be constituted by the light transmissive electrode 1 and the anode may be constituted by the light reflective electrode 2.

A light exit layer may be provided between the substrate 7 and the light transmissive electrode 1. The light exit layer is a layer having a function in which total reflection by the substrate 7 is suppressed and light is allowed to exit more to the outside. The light exit layer may have a structure in which a difference in refractive index between the substrate 7 and the organic EL layer is reduced. A reduction in the difference in refractive index enables the suppression of total reflection and allows light to exit. Also, the light exit layer may have a light-scattering structure. By scattering light, the direction of the light is changed, whereby total reflection is suppressed, and light can be allowed to exit. The light exit layer may be formed with a layered structure of a low refractive index layer and a high refractive index layer, for example. Alternatively, the light exit layer may be formed with an uneven structure of an interface between the two layers, for example. Alternatively, the light exit layer may be formed by a layer in which light-scattering particles are dispersed, for example.

A light exit structure may be provided on the surface opposite (external side of the element) to the light transmissive electrode 1 of the substrate 7. The light exit structure may be configured by the light-scattering structure. For example, by providing a layer containing light-scattering particles or a minute uneven structure on the surface of the substrate 7, the light exit structure can be formed.

Figure 6:
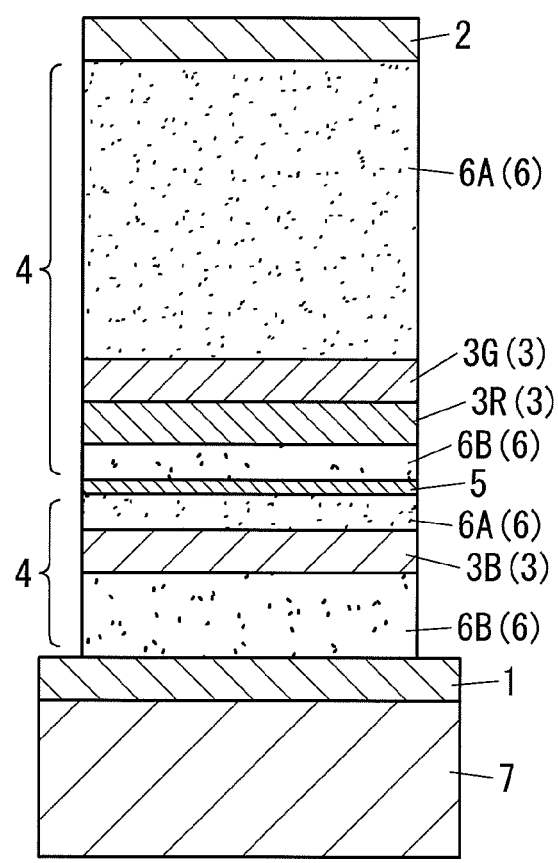
FIG. 6 is a cross-sectional view schematically showing a layer configuration of an organic luminescent element having a two-stage multi-unit structure.

Incidentally, the organic EL element shown in FIG. 6 is a two-unit multi-element (reference example) in which a phosphorescent unit is disposed as the light-emitting unit 4 located near the light reflective electrode 2, and a fluorescent unit is disposed as the light-emitting unit 4 located near the light transmissive electrode 1. The above-described phosphorescent unit includes the green light-emitting layer 3G disposed on the light reflective electrode 2 side and the red light-emitting layer 3R disposed on the light transmissive electrode 1 side, and both of the light-emitting layers 3 contain a phosphorescent material as a light-emitting material. Also, the above-described fluorescent unit includes the blue light-emitting layer 3B containing a fluorescent material as a light-emitting material.

Figure 3:
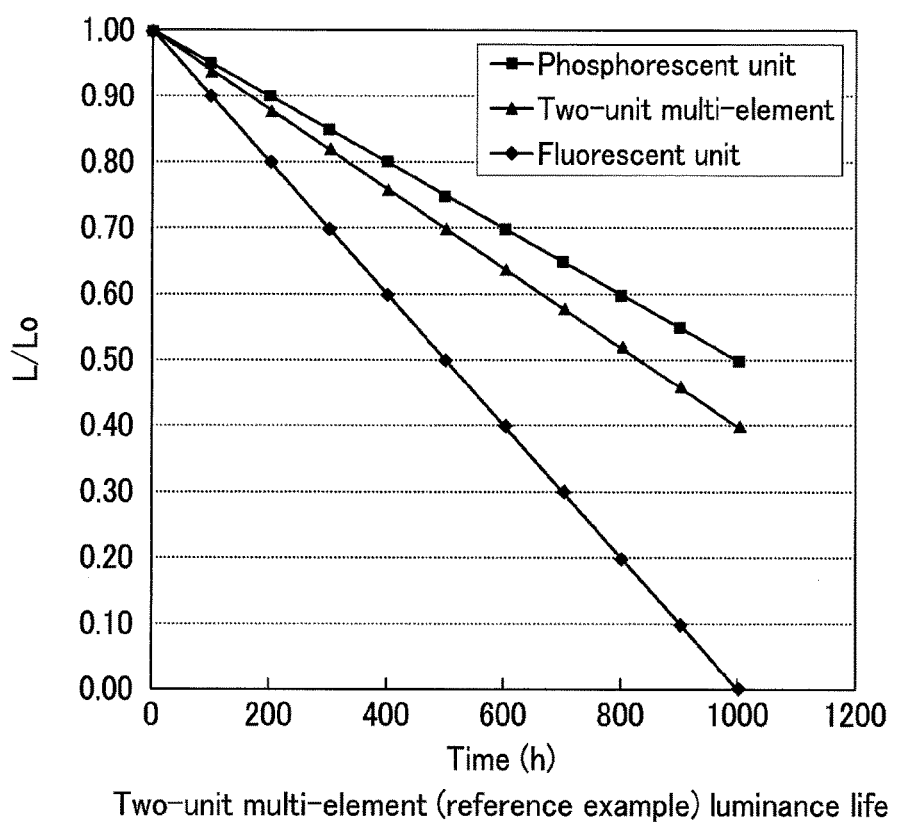
FIG. 3 is a graph showing luminance lives of organic luminescent elements according to a reference example.

FIG. 3 is a graph showing the luminance life of the above-described two-unit multi-element as a whole, the luminance life of the phosphorescent unit alone, and the luminance life of the fluorescent unit alone.

In contrast to this, the organic EL element shown in FIG. 1 is a three-unit multi-element (working example) in which the phosphorescent unit is disposed as the light-emitting unit 4 located near the light reflective electrode 2, another phosphorescent unit is disposed as a light-emitting unit 4 adjacent to this, and the fluorescent unit is disposed as the light-emitting unit 4 located near the light transmissive electrode 1. The above-described two phosphorescent units are the similar-color light-emitting units 4S, and include the respective green light-emitting layers 3G disposed on the light reflective electrode 2 side, and the respective red light-emitting layers 3R disposed on the light transmissive electrode 1 side, and both of the light-emitting layers 3 also contain a phosphorescent material as a light-emitting material. However, the luminance life of the phosphorescent unit near the light reflective electrode 2 is long, whereas the phosphorescent unit adjacent thereto has a short luminance life. Hereinafter, for simplicity, the former is referred to as a long-life phosphorescent unit and the latter is referred to as a short-life phosphorescent unit. The phosphorescent unit of the above-described two-unit multi-element is the same as the long-life phosphorescent unit of the three-unit multi-element, and the luminance lives of both phosphorescent units are the same. Also, the above-described fluorescent unit is the same as the fluorescent unit of the two-unit multi-element. In this manner, the three-unit multi-element of the working example has a structure obtained by adding another phosphorescent unit, which emits light in a similar color and has a short luminance life (short-life phosphorescent unit), to the two-unit multi-element of the reference example.

Figure 4:
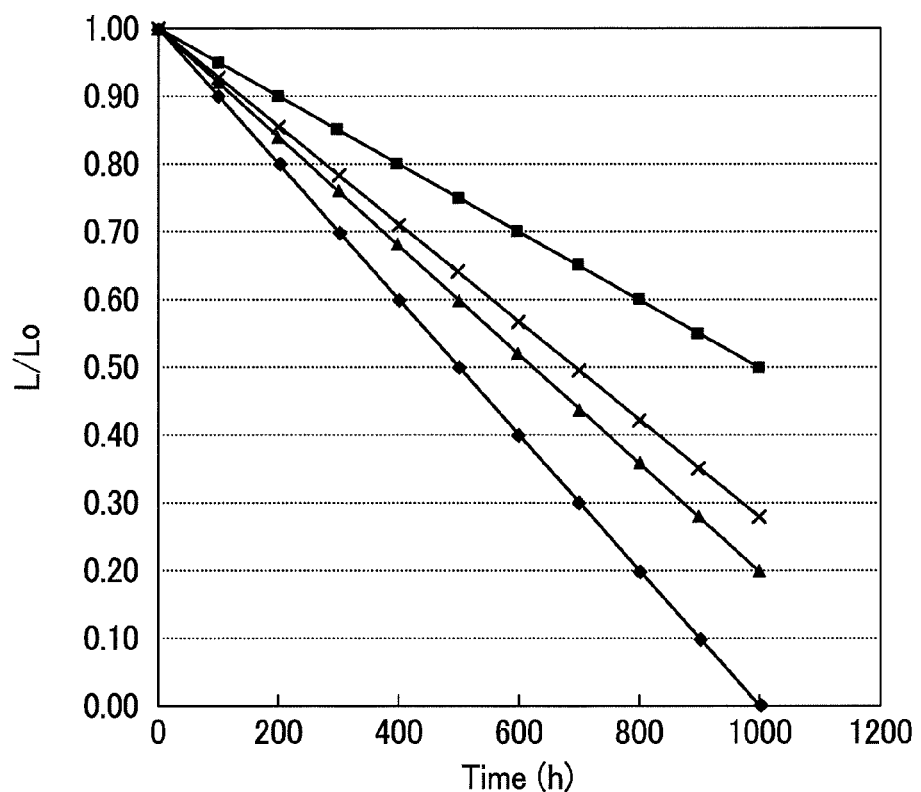
FIG. 4 is a graph showing luminance lives of organic luminescent elements according to a working example.

FIG. 4 is a graph showing the luminance life of the above-described three-unit multi-element as a whole, the luminance life of the long-life phosphorescent unit alone, the luminance life of the short-life phosphorescent unit alone, and the luminance life of the fluorescent unit alone.

Figure 5:
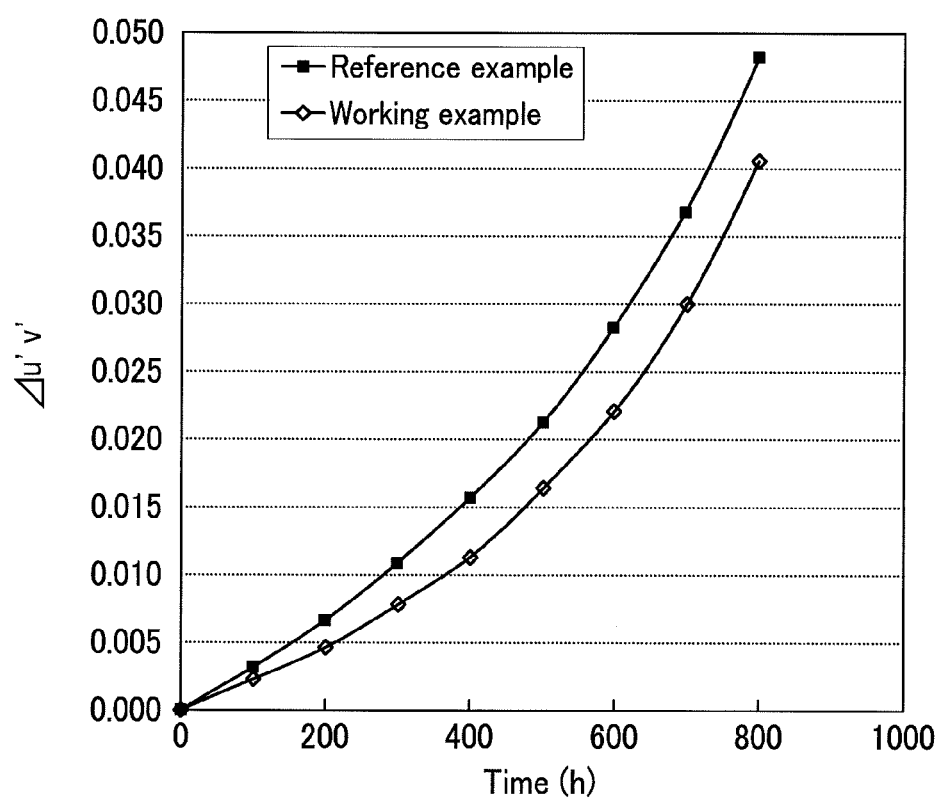
FIG. 5 is a graph showing aging in color shift.

FIG. 5 is a graph showing aging of color shift of the above-described two-unit multi-element (reference example) and three-unit multi-element (working example). The horizontal axis expresses elapsed time, and the vertical axis expresses color shift ($\Delta u'v'$). Note that color shift is the color shift from the standard white color of display colors obtained in the case where a light-emitting surface is observed in a direction of 60 degrees relative to the normal line of the light-emitting surface of an element. $\Delta u'v'$ is the square root of the sum of the square of a difference $\Delta u'$ in the chromaticity coordinate u' and the square of a difference $\Delta v'$ in the chromaticity coordinate v'.

Comparing FIG. 3 to FIG. 4, by adding the short-life phosphorescent unit, the luminance life of the three-unit multi-element as a whole is shorter than the luminance life of the two-unit multi-element as a whole.

However, as is clear from FIG. 5, the value of $\Delta u'v'$ is smaller in the three-unit multi-element of the working example than in the two-unit multi-element of the reference example upon the elapse of a given time, and therefore it can be understood that color shift can be suppressed more with the working example than with the reference example. In other words, in the working example, by additionally inserting the short-life phosphorescent unit between electrodes, the lives of the similar-color light-emitting units 4S serving as the red and green color units can be brought closer to the life of the different-color light-emitting unit 4D serving as the blue color unit, and a relative color change can be suppressed. In this manner, according to the organic EL element of the present embodiment, aging of chromaticity can be reduced and color shift can be suppressed. Accordingly, the organic EL element of the present invention can be used favorably for a lighting panel or the like.

Hereinafter, materials used in the above-described organic EL element, and manufacturing of the organic EL element will be described.

An appropriate substrate material that is suitable to form an organic EL element can be used as the substrate 7. For example, a glass substrate, a resin substrate, or the like can be used. If the glass substrate is used, a transparent substrate that has durability and high light emitting properties can be easily obtained.

An appropriate electrically conductive material is used to form an electrode (anode or cathode) as the light transmissive electrode 1 or the light reflective electrode 2.

It is preferable to use an electrode material made of metal, alloy, or an electroconductive compound that has a high work function, or a mixture thereof, as the anode. In the case of light being allowed to exit from the anode, the anode can be constituted by a transparent conductive film. Examples of the configuration of the anode include a metal thin film, transparent metal oxide film, and organic conductive film. Examples of the material for the anode include metals such as gold, CuI, ITO (indium-tin oxide), $SnO_2$, ZnO, and IZO (indium-zinc oxide), conductive polymers such as PEDOT and polyaniline, conductive polymers doped with any acceptor, and conductive light transmissive materials such as carbon nanotubes. If ITO or the like is used, a transparent electrode having high conductivity can be formed.

Also, it is preferable to use an electrode material made of metal, alloy, or an electroconductive compound that has a low work function, or a mixture thereof, as the cathode. Examples of the material for the cathode include alkali metals, alkaline earth metals, and alloys of these metals and other metals. Specific examples of the material for the cathode include aluminum, silver, sodium, sodium-potassium alloy, lithium, magnesium, magnesium-silver mixture, magnesium-indium mixture, and aluminum-lithium alloy. Furthermore, conductive materials such as metal may be stacked to form one or more layers and the stack may be used as the cathode. Examples thereof include a stack of an alkali metal and Al, a stack of an alkaline earth metal and Al, a stack of an alkaline earth metal and Ag, and a stack of a magnesium-silver alloy and Ag. If aluminum, silver, or the like is used, an electrode having a high reflectivity can be formed.

The light-emitting layer 3 is formed so as to include a guest material that is a dopant compound (light-emitting dopants), and a host material that contains the dopant compound.

CBP, CzTT, TCTA, mCP, CDBP, or the like may be used as the host for a phosphorescent layer 3. $Ir(ppy)_3$, $Ir(ppy)_2$(acac), $Ir(mppy)_3$, or the like may be used as a phosphorescent green light-emitting dopant. $Btp_2Ir(acac)$, $Bt_2Ir(acac)$, PtOEP, or the like may be used as a phosphorescent red light-emitting dopant. FIr(pic) or the like may be used as a phosphorescent blue light-emitting dopant. The doping concentration of phosphorescent dopants may be set to 1 to 40 mass %.

$Alq_3$, ADN, BDAF, TBADN, or the like may be used as the host for a fluorescent layer 3. C545T, DMQA, coumarin 6, rubrene, or the like may be used as a fluorescent green light-emitting dopant. TBP, BCzVBi, perylene, or the like may be used as a fluorescent blue light-emitting dopant. DCJTB or the like may be used as a fluorescent red light-emitting dopant. Also, electrical charge transfer auxiliary dopants are preferably used in the fluorescent layer 3, and NPD, TPD, Spiro-TAD, or the like may be used, for example. The doping concentration of the sum of light-emitting dopants and electrical charge transfer auxiliary dopants may be set to 1 to 30 mass %.

BCP:Li, ITO, NPD:$MoO_3$, Liq:Al, or the like may be used as the interlayer 5. For example, the interlayer 5 may have a two-layer configuration in which a first layer constituted by BCP:Li is disposed on the anode side and a second layer constituted by ITO is disposed on the cathode side. Also, the interlayer 5 may be constituted by a metal thin film. The metal thin film can transmit light. For example, the interlayer 5 may be made of Ag, Al, or the like.

CuPc, MTDATA, TiOPC, HAT-CN6, or the like may be used as the positive hole injection layer. Also, a positive hole transfer organic material doped with acceptors may be used for the positive hole injection layer. Examples of acceptors include $MoO_3$, $V_2O_5$, and F4TCNQ.

TPD, NPD, TPAC, DTASi, or triarylamine-based compounds may be used as the positive hole transport layer 6B.

BCP, TAZ, BAlq, $Alq_3$, OXD7, PBD, or the like may be used as the electron transport layer 6A.

In addition to fluorides, oxides, and carbonate of alkali metal or alkaline earth metal, such as LiF, $Li_2O$, MgO, and $Li_2CO_3$, a layer obtained by doping an organic layer with alkali metal or alkaline earth metal such as lithium, sodium, cesium, or calcium may be used as the electron injection layer.

Note that in the above-described material, CBP expresses 4,4'-N,N'-dicarbazole biphenyl. Also, $Alq_3$ expresses tris(8-oxoquinoline) aluminum (III). Also, TBADN expresses 2-t-butyl-9,10-di(2-naphthyl) anthracene. Also, $Ir(ppy)_3$ expresses fac-tris (2-phenylpyridine) indium. Also, $Btp_2Ir$ (acac) expresses bis-(3-(2-(2-pyridyl)benzothienyl)mono-acethylacetonate) iridium (III) Also, C545T is coumarin C545T, and expresses 10-2-(benzothiazolyl)-2,3,6,7-tetrahydro-1,1,7,7-tetramethyl-1H,5H, 11H-(1) benzopyropyrano(6,7,-8-ij)quinolizine-11-one. Also, TBP expresses 1-tert-butyl-perylene. Also, NPD expresses 4,4'-bis [N-(naphthyl)-N-phenyl-amino]biphenyl. Also, BCP expresses 2,9-dimethyl-4,7-diphenyl-1,10-phenanthroline. Also, CuPc expresses copper phthalocyanine. Also, TPD expresses N,N'-bis(3-methylphenyl)-(1,1'-biphenyl)-4,4'-diamine.

A material as described above is formed into a film with an appropriate method in an appropriate order and the formed films are stacked, as a result of which an organic EL element having a layer configuration shown in FIG. 1 can be manufactured. Usually, stacking may be performed starting from the substrate 7 side.

The film thickness of each electrode may be set to about 10 to 300 nm. The length from the light transmissive electrode 1 to the light reflective electrode 2 may be set to about 10 to 1000 nm, and preferably set to about 50 to 500 nm.

Examples of film formation methods include a vacuum deposition method, sputtering method, and coating method, but the film formation methods are not particularly limited thereto.

Here, in order to obtain stable planar light emission, it is preferable to form a film such that the thickness of each layer in the plane is close to being uniform. For example, with the vacuum deposition method, by appropriately adjusting a vapor source angle, a distance (height) between a substrate and a vapor source, a distance (offset) between a substrate rotational center and a vapor source, and the like, variation in thickness can be reduced and a layer in which desired film thickness conditions are satisfied can be obtained.

REFERENCE SIGNS LIST

3 Light-emitting layer
4 Light-emitting unit
4S Similar-color light-emitting unit
4D Different-color light-emitting unit

The invention claimed is:

1. An organic electroluminescent element, comprising:
a light transmissive electrode;
a light reflective electrode;
three light-emitting units being provided between the light transmissive electrode and the light reflective electrode;
the three light-emitting units being stacked in layers;
an interlayer being provided between adjoining light-emitting units, and configured to inject an electrical charge into each light-emitting unit adjacent thereto;
two light-emitting units of the three light-emitting units being similar-color light-emitting units that emit light in a similar color, and that have mutually different luminance lives; and
a remaining light-emitting unit of the three light-emitting units being a different-color light-emitting unit that emits light in a color that is different from the similar color, and that has a luminance life that is shorter than each luminance life of the two similar-color light-emitting units.

2. The organic electroluminescent element according to claim 1, wherein
the different-color light-emitting unit comprises a light-emitting layer containing a blue light-emitting material.

3. The organic electroluminescent element according to claim 1, wherein
the different-color light-emitting unit comprises a light-emitting layer containing a fluorescent material as a light-emitting material.

4. The organic electroluminescent element according to claim 1, wherein
the two similar-color light-emitting units comprise respective light-emitting layers that differ in layered structure or composition.

5. The organic electroluminescent element according to claim 1, wherein
the two similar-color light-emitting units comprise respective light-emitting layers containing a phosphorescent material as a light-emitting material.

6. The organic electroluminescent element according to claim 1, wherein
the two similar-color light-emitting units comprise respective light-emitting layers containing both a red light-emitting material and a green light-emitting material.

7. The organic electroluminescent element according to claim 1, wherein
the two similar-color light-emitting units comprise respective light-emitting layers which contain light-emitting materials and each of which contains at least one identical light-emitting material.

8. The organic electroluminescent element according to claim 1, wherein
the two similar-color light-emitting units comprise respective light-emitting layers which contain light-emitting materials and each of which contains at least one different light-emitting material.

9. The organic electroluminescent element according to claim 2, wherein
the different-color light-emitting unit comprises a light-emitting layer containing a fluorescent material as the blue light-emitting material.

10. The organic electroluminescent element according to claim 2, wherein the two similar-color light-emitting units comprise respective light-emitting layers that differ in layered structure or composition.

11. The organic electroluminescent element according to claim 2, wherein
the two similar-color light-emitting units comprise respective light-emitting layers containing a phosphorescent material as a light-emitting material.

12. The organic electroluminescent element according to claim 2, wherein
the two similar-color light-emitting units comprise respective light-emitting layers containing both a red light-emitting material and a green light-emitting material.

13. The organic electroluminescent element according to claim 2, wherein
the two similar-color light-emitting units comprise respective light-emitting layers which contain light-emitting materials and each of which contains at least one identical light-emitting material.

14. The organic electroluminescent element according to claim 2, wherein
the two similar-color light-emitting units comprise respective light-emitting layers which contain light-emitting materials and each of which contains at least one different light-emitting material.

* * * * *